(12) United States Patent
Lo et al.

(10) Patent No.: US 7,473,586 B1
(45) Date of Patent: Jan. 6, 2009

(54) METHOD OF FORMING FLIP-CHIP BUMP CARRIER TYPE PACKAGE

(75) Inventors: Wai Yew Lo, Selangor (MY); Heng Keong Yip, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 29 days.

(21) Appl. No.: 11/849,301

(22) Filed: Sep. 3, 2007

(51) Int. Cl.
*H01L 21/00* (2006.01)
(52) U.S. Cl. .............. 438/127; 438/106; 438/110; 438/612; 257/E21.499; 257/E21.502; 257/E21.705
(58) Field of Classification Search ........... 257/E21.532
See application file for complete search history.

(56) References Cited

U.S. PATENT DOCUMENTS

| | | | |
|---|---|---|---|
| 4,259,436 | A | 3/1981 | Tabuchi et al. |
| 6,064,114 | A | 5/2000 | Higgins, III |
| 6,100,112 | A | 8/2000 | Amano et al. |
| 6,306,685 | B1 | 10/2001 | Liu et al. |
| 7,364,941 | B2 * | 4/2008 | Usui et al. .......... 438/106 |
| 2004/0106288 | A1 * | 6/2004 | Igarashi et al. ....... 438/689 |
| 2007/0108605 | A1 | 5/2007 | Yoon et al. |

OTHER PUBLICATIONS

Marie S.Cole, Karl J. Puttlitz Sr. IBM and the industry's pursuit of lead (Pb) elimination/ reduction from microelectronic packaging, Power Architecture Community Newsletter, Mar. 15, 2005, 5 pages, http://www.ibm.com/developerworks/library/pa-nl5-community/.

* cited by examiner

*Primary Examiner*—Walter L Lindsay, Jr.
*Assistant Examiner*—Cheung Lee
(74) *Attorney, Agent, or Firm*—Charles Bergere

(57) ABSTRACT

A flip-chip bump carrier type package is formed by providing a sheet of metal foil and forming cavities in a first surface of the sheet. The cavities are plated with a conductive metal to form external interconnects. An insulating film is formed over the metal foil first surface and the plated cavities and then vias are formed in the insulating film. The vias contact respective ones of the plated cavities. The vias are then plated and a solder resist film is formed over the insulating film and the plated vias. The solder resist film is processed to form exposed areas above the vias, which areas are then plated with a conductive metal. A bumped semiconductor die is attached to the first surface of the metal foil, where the die bumps contact respective ones of the plated, exposed areas, which electrically connects the die to the plated cavities. Finally, the sheet of metal foil is removed so that outer surfaces of the plated cavities are exposed. As stated above, the plated cavity outer surfaces form electrical interconnects between the die and a printed wiring board.

14 Claims, 3 Drawing Sheets

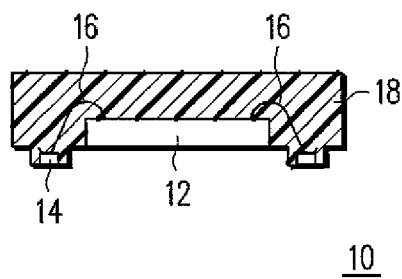
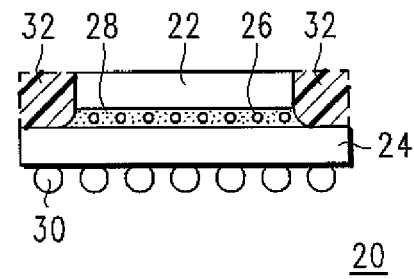
FIG. 1
—PRIOR ART—
FIG. 2
—PRIOR ART—
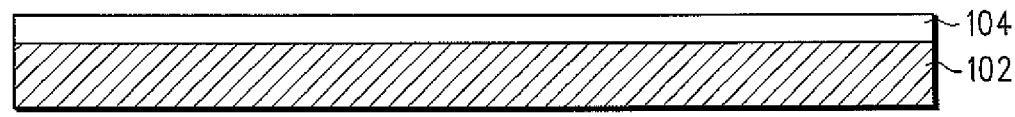
FIG. 3
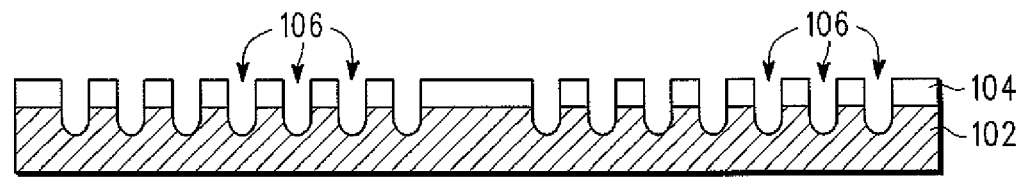
FIG. 4

METHOD OF FORMING FLIP-CHIP BUMP CARRIER TYPE PACKAGE

BACKGROUND OF THE INVENTION

The present invention relates to the packaging of integrated circuits (ICs) and more particularly to a method of forming a flip-chip, bump carrier type package.

Modern consumer electronics, such as cellular phones, digital cameras, and digital music players are driving a demand for smaller integrated circuits. Thus, semiconductor manufacturers and packaging companies are continually shrinking the footprint of packaged electronic devices yet at the same time increasing circuit functionality. One way of reducing package size is to use a bumped die and electrically connect the die to a substrate or carrier in a face-down manner. This is known as flip-chip assembly because the chip is face down or flipped, as compared to wire-bonding technology, where the chip is face-up and wires are connected between bond pads on the top of the chip and the carrier to which the bottom of the chip is attached. Although flip-chip technology is not new, it is just now becoming increasingly popular.

FIG. 1 shows a packaged device 10 in which a semiconductor die 12 is electrically connected to stud bumps 14 with wires 16. The wires 16 extend from a top of the die 12 to the stud bumps 14. A plastic material 18 covers the wires and the top of the die 10 for protection. FIG. 2 shows a packaged device 20 in which a semiconductor die 22 is electrically connected to a carrier or substrate 24 with bumps 26. An underfill material 28 is disposed between the die 22 and the carrier 24. Solder balls 30 are attached to an opposing side of the carrier 24 to provide electrical connection to other electronic devices. A plastic material 32, indicated with dashed lines, is formed around the die 22 to complete the package 20.

The packaging process can be very complex due to the varying compositions of the materials, like the carrier, the die, the solder balls and the mold compound. Problems caused by excessive heat and tight tolerances are often encountered. For example, the solder balls 30 sometimes fall off or disengage from the carrier 24. It would be advantageous to provide a method of making a reliable flip-chip packaged device.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 1 is an enlarged cross-sectional view of a conventional bump chip carrier type package;

FIG. 2 is an enlarged cross-sectional view of a conventional flip-chip ball grid array type package; and FIGS. 3-12 are enlarged cross-sectional views illustrating a method of forming flip-chip bump carrier type packaged devices in accordance with an embodiment of the present invention.

DETAILED DESCRIPTION OF THE INVENTION

Figure 5:
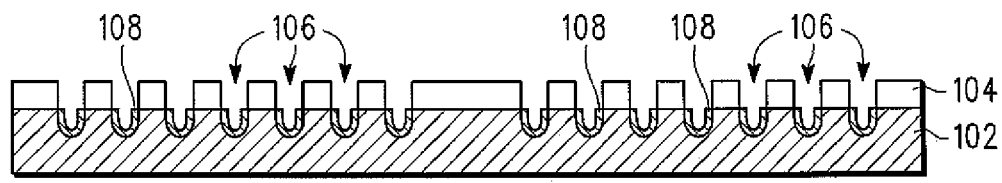

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of forming a semiconductor package including the steps of providing a sheet of metal foil and forming a plurality of cavities in a first surface of the sheet of metal foil. The cavities are plated with a conductive metal. An insulating film is formed over the metal foil first surface and the plated cavities. Vias are then cut in the insulating film. The vias contact respective ones of the plated cavities. Next the vias are plated with a conductive metal. A solder resist film is formed over the insulating film and the plated vias and processed to form exposed areas above the vias. The exposed areas are then plated with a conductive metal. A bumped flip chip die is attached to the first surface of the metal foil. The die bumps contact respective ones of the plated, exposed areas, which electrically connects the die to the plated cavities. The sheet of metal foil is removed, exposing the outer surfaces of the plated cavities such that the plated cavity outer surfaces form electrical interconnects to a printed wiring board or external carrier.

A method of forming a plurality of flip-chip bump carrier type packages 100 will now be described below with reference to FIGS. 3-12.

Referring now to FIG. 3, a strip or sheet of conductive material 102 is provided. The conductive material sheet 102 may be square, rectangular or round like a wafer and may be shaped for example by cutting, stamping or etching. In one embodiment, the conductive material sheet 102 is formed of a bare metal such as copper foil and is about 0.5 mm thick. However, the present invention is not limited by the specific material, size or thickness of the metal sheet 102.

A photolithographic material 104 is applied to a first or top surface of the conductive sheet 102 and cured. A photo mask, not shown, is placed over the photolithographic material. As is known in the art, the photolithographic material 104 may comprise a resist coating or a dry film lamination.

Referring to FIG. 4, the photolithographic material 104 and the conductive sheet 102 are exposed and developed or otherwise processed in a known manner to form a predetermined pattern on the top surface of the conductive sheet 102. Then the conductive sheet 102 is etched. One known etching method is to use an acid bath in which the non-laminated or coated areas are etched. The predetermined pattern comprises a plurality of cavities 106 that cut through the photolithographic material 104 and into the conductive sheet 102.

Referring to FIG. 5, the cavities 106 are plated with a conductive metal 108 to form external electrical interconnections, as will become apparent later. The conductive metal 108 could be a metal such as gold or an alloy composed of, for example, Palladium and Nickel. In one embodiment of the invention, Ni/Cu plating is applied after an initial gold plating in order to assist in subsequent trace build up described below.

Figure 6:
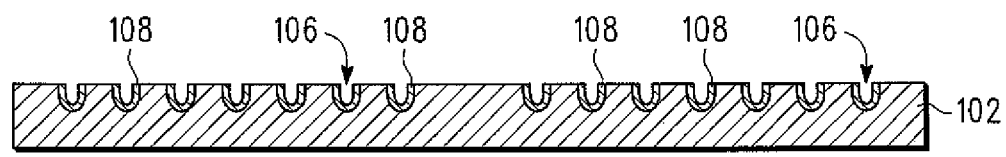

FIG. 6 shows the conductive sheet 102 with plated cavities 106 in which the photolithographic material 104 has been stripped off. The photolithographic material 104 may be removed either manually or via machine.

Figure 7:
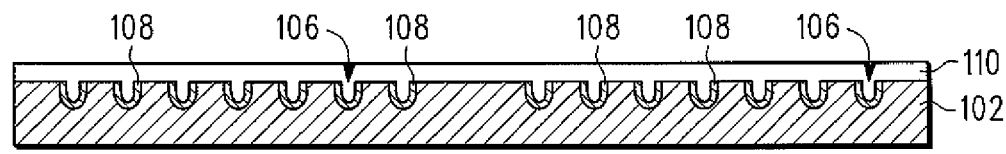

FIG. 7 shows an insulating film 110 that has been applied to the conductive sheet 102 and plated cavities 106. The insulating film 110 may comprise a solder mask material that is laminated over the conductive sheet 102 and plated cavities 106 and then thermally cured. After curing, vias are formed in the insulating film at the edges of the plated cavities 106.

Figure 8:
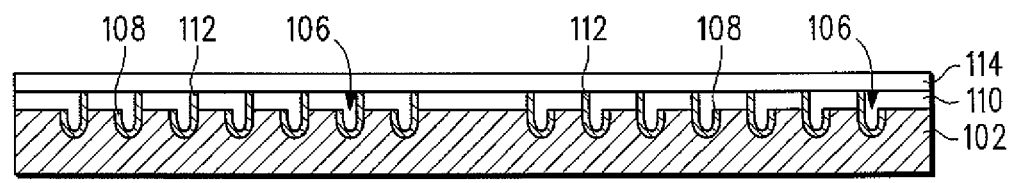

FIG. 8 shows the vias 112 after that have been formed in the insulating film 110. The vias 112 may be formed using a laser, as is known in the art. In one embodiment of the present invention, the vias 112 extend through the insulating film 110 proximate to edges of the plated cavities 106. After formation of the vias 112, the vias 112 are plated with a conductive metal. For example, the vias 112 may be electroplated with gold. In one embodiment of the invention, the vias 112 are plated first with Copper and then again with a Ni/Cu alloy. FIG. 8 also shows a solder resist film 114 that has been applied over the insulating film 110 and the plated vias 112. The solder resist film 114 could be formed over the insulating film 110 and then the vias 112 cut through both the insulating film 110 and the solder resist film 114.

Figure 9:
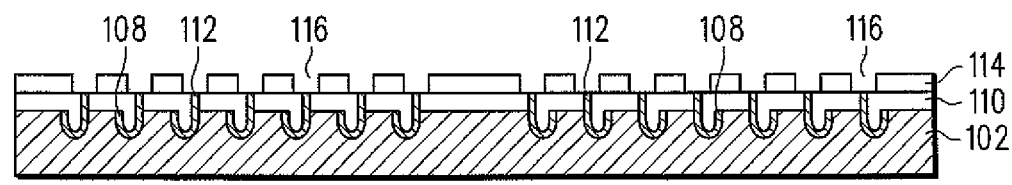
Figure 11:
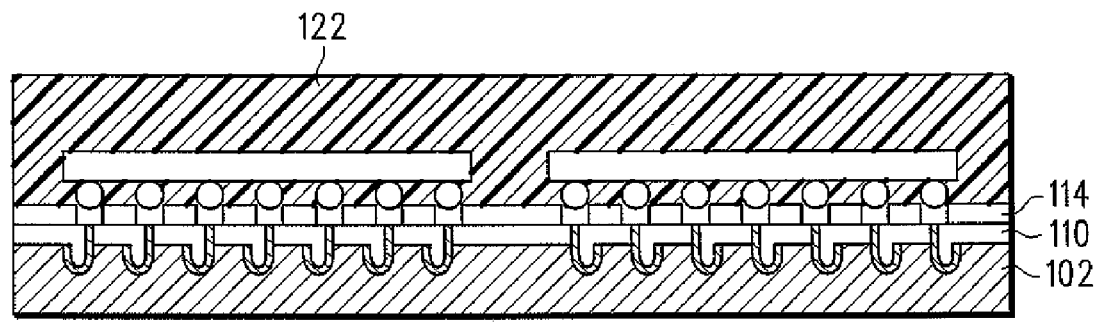

Next, as shown in FIG. 9, the solder resist film 114 is processed, i.e., exposure, development and thermal cure using a mask and photo-imaging, as is known in the art, in order to form open areas 116. The open areas 116 are formed over the vias 112 and are sized to receive bumps formed on the back of a semiconductor die (FIG. 11). A plating process is then performed on the open areas 116 to plate the open areas 116 with a base metal, such as gold. If Ni/Cu plating is used, then a solder cladding also may be applied to the open areas after the plating process.

Figure 10:
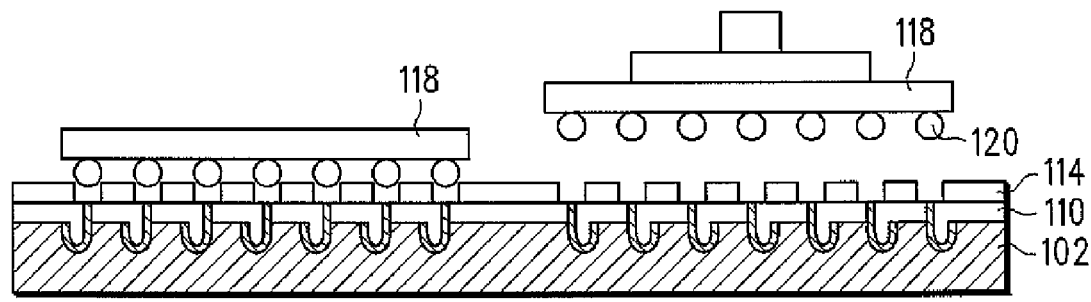

FIG. 10 shows a flip chip die 118 being attached to the now built up conductive sheet 102 such that the bumps 120 on the bottom of the die 118 are aligned with and received within respective ones of the open areas 116. The bumps 120 are electrically connected to the plated cavities 106 by way of the plated vias 112. The IC dies 118 may be processors, such as digital signal processors (DSPs), microcontrollers, special function circuits, such as memory address generators, or circuits that perform any other type of function. The IC dice 22 are not limited to a particular technology such as CMOS, or derived from any particular wafer technology. Further, the present invention can accommodate various die sizes, as will be understood by those of skill in the art. A typical example is a flash memory device having a size of about 6 mm by 6 mm.

FIG. 11 shows the conductive sheet 102 with two flip chip dies 118 attached thereto after an encapsulation process has been performed. That is, encapsulation or molding is performed to form a plastic material 122 around the dies 118. The plastic material 122 encapsulating the dies 118 may comprise well known commercially available molding materials such as plastic or epoxy. Of course, more than two of the dies can be attached to a built-up conductive sheet, as two are shown for illustration purposes only.

Figure 12:
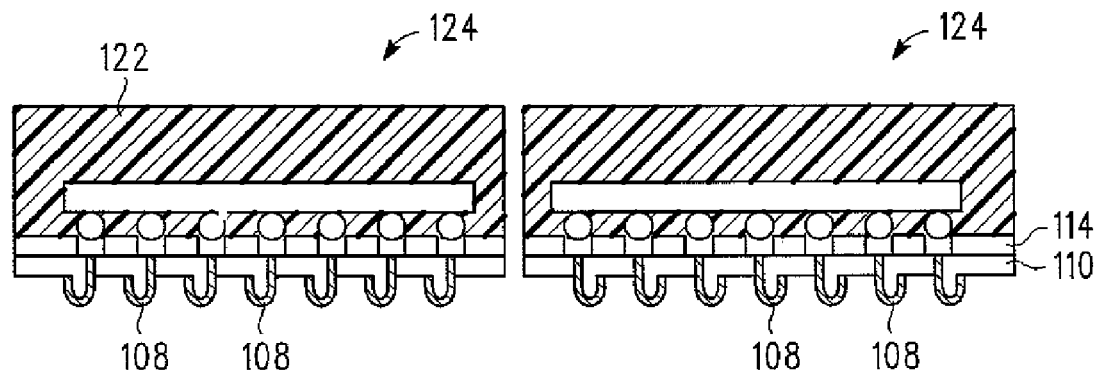

Referring now to FIG. 12, the conductive sheet 102 is removed (e.g., back copper removal). The conductive sheet 102 may be removed via etching done in a solution that dissolves away the sheet of conductive metal 102 to expose the plated surface 108 of the cavities 106, which thereby form terminals. In one embodiment of the invention, the terminals formed by the plated cavities are CS bumps.

Finally, a dicing process is carried out to form individual packaged devices 124. Dicing may be done via saw singulation or laser cutting, as are known in the art. The present invention can accommodate various package sizes, as will be understood by those of skill in the art.

As is evident from the foregoing discussion, the present invention provides bump chip carrier type package constructed using a flip chip die. The present invention allows for packages with peripheral, partial array and full bump array layouts. A full array may be formed by re-routing the traces and building up additional layers. CS bumps are built-up at the start of the process and form an integral part of the substrate. Thus, there is no need for additional CS solder ball attach at the assembly back end. As the bumped Cs solder ball is part of the overall package structure, the solder ball drop issue is eliminated. The insulation film 110 on the bumps provides stress relief that reduces the direct stress impact on the joint during thermal cycling after attaching the packaged device 124 to a printed circuit board. This stress relief offers mechanical stress and strain absorption during electrical testing via the CS bumps.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of packaging a semiconductor integrated circuit, comprising:
   providing a sheet of metal foil;
   forming a plurality of cavities in a first surface of the sheet of metal foil;
   plating the cavities with a conductive metal;
   forming an insulating film over the metal foil first surface and the plated cavities;
   forming a plurality of vias in the insulating film, wherein the vias contact respective ones of the plated cavities;
   plating the vias with a conductive metal;
   forming a solder resist film over the insulating film and the plated vias;
   processing the solder resist film to form exposed areas above the vias;
   plating the exposed areas above the vias with a conductive metal;
   attaching a bumped semiconductor die to the first surface of the metal foil, wherein the die bumps contact respective ones of the plated, exposed areas thereby electrically connecting the die to the plated cavities; and
   removing the sheet of metal foil so that outer surfaces of the plated cavities are exposed, whereby said plated cavity outer surfaces form electrical interconnects to the semiconductor die.

2. The method of packaging a semiconductor integrated circuit of claim 1, wherein the sheet of metal foil is comprised of copper.

3. The method of packaging a semiconductor integrated circuit of claim 1, wherein the step of forming the plurality of cavities in the first surface of the metal foil sheet comprises:
   forming a coating on the first surface of the metal foil sheet;
   masking the coating; and
   processing the masked coating to form the cavities.

4. The method of packaging a semiconductor integrated circuit of claim 3, wherein the step of forming a coating on the first surface of the metal foil sheet comprises one of forming a resist coating and laminating a dry film on the first surface of the foil sheet.

5. The method of packaging a semiconductor integrated circuit of claim 4, wherein the step of processing the masked coating to form the cavities comprises etching the first surface of the foil sheet.

6. The method of packaging a semiconductor integrated circuit of claim 1, further comprising the step of removing a coating formed on the metal foil first surface before said insulating film is formed over the metal foil first surface.

7. The method of packaging a semiconductor integrated circuit of claim 1, wherein the conductive metal for plating the cavities comprises gold.

8. The method of packaging a semiconductor integrated circuit of claim 1, wherein the insulating film comprises a solder mask.

9. The method of packaging a semiconductor integrated circuit of claim 8, wherein the vias are formed in the solder mask with a laser.

10. The method of packaging a semiconductor integrated circuit of claim 1, wherein the vias are plated with gold.

11. The method of packaging a semiconductor integrated circuit of claim 1, further comprising the step of encapsulating the semiconductor die, the first surface of the metal foil.

12. A packaged device formed according to the method of claim 1.

13. A method of forming a plurality of semiconductor packages, the method comprising:

provviding a sheet of metal foil;

forming a plurality of cavities in a first surface of the sheet of metal foil;

plating the cavities with a conductive metal;

forming an insulating film over the metal foil first surface and the plated cavities;

forming a plurality of vias in the insulating film, wherein the vias contact respective ones of the plated cavities;

plating the vias with a conductive metal;

forming a solder resist film over the insulating film and the plated vias;

processing the solder resist film to form exposed areas above the vias;

plating the exposed areas above the vias with a conductive metal;

attaching a plurality of bumped semiconductor die to the first surface of the metal foil, wherein the die bumps contact respective ones of the plated, exposed areas;

encapsulating the semiconductor dies and the first surface of the metal foil;

removing the sheet of metal foil so that outer surfaces of the plated cavities are exposed, whereby said plated cavity outer surfaces form electrical interconnects to the semiconductor dies; and performing a singulating operation to separate adjacent ones of the dies thereby forming individual semiconductor packages.

14. A packaged semiconductor circuit formed in accordance with the method of claim 13.

* * * * *